United States Patent [19]
Ohta et al.

[11] 4,175,288
[45] Nov. 20, 1979

[54] MAGNETIC BUBBLE MEMORY DEVICES

[75] Inventors: Hirofumi Ohta; Toshio Futami; Kazuo Umeyama, all of Mobara, Japan

[73] Assignee: Hitachi, Ltd., Tokyo, Japan

[21] Appl. No.: 880,586

[22] Filed: Feb. 23, 1978

[30] Foreign Application Priority Data

Apr. 27, 1977 [JP] Japan ................... 52-47907

[51] Int. Cl.$^2$ ............................................. G11C 19/08
[52] U.S. Cl. ................................ 365/2; 365/53; 365/54; 365/209
[58] Field of Search ................... 365/2, 53, 54, 209

[56] References Cited
PUBLICATIONS

IBM Technical Disclosure Bulletin—vol. 6, No. 2, Jul. 1963, pp. 71 & 72.

*Primary Examiner*—James W. Moffitt
*Attorney, Agent, or Firm*—Charles E. Pfund

[57] ABSTRACT

In a magnetic bubble memory device, positive signal lines interconnecting a magnetic bubble memory chip located at substantially the center of an insulating substrate and lead pins at the end of the substrate are surrounded by a plurality of grounded conductors for shielding the positive signal lines so as to decrease noise induced therein by a voltage drop across coils for producing the rotating magnetic field.

4 Claims, 6 Drawing Figures

MAGNETIC BUBBLE MEMORY DEVICES

BACKGROUND OF THE INVENTION

This invention relates to a magnetic bubble memory device, more particularly a magnetic bubble memory device operated by a bias magnetic field perpendicular to the magnetic memory chip and a rotating magnetic field parallel to the chip.

Generally, a magnetic bubble memory device is constituted by a magnetic film, a magnetic bubble chip comprising a pattern of a soft ferromagnetic film formed on the magnetic film, lead wires for transmitting signals between the chip and an external circuit, a coil block for applying a horizontal rotating magnetic field to the chip and a magnet block for appyling a perpendicular bias magnetic field to the chip. Any desired information is written, stored and read out from the memory device by forming, transporting and dividing magnetic bubbles in the pattern of the soft ferromagnetic film.

As will be described later with reference to the accompanying drawing, in a typical magnetic bubble memory device, the magnetic bubble chip is mounted on an insulating substrate at substantially the center thereof and a fine output signal line is connected between the chip and a lead pin on one end of the insulating substrate. The length of the electric wire including a detector installed in the magnetic bubble chip is of the order of microns, whereas the length of the signal line between the chip and the lead pin is of the order of centimeters which is much longer than the internal wiring. On the other hand, coils for applying a horizontal rotating magnetic field to the magnetic bubble chip are wound about the insulating substrate so as to surround the chip and the signal line, and a voltage of several tens of volts is induced across the coil for producing the rotating magnetic field by a high frequency AC current flowing through the coil. This terminal voltage induces an induction noise in the wiring inside the chip and in the signal line through the capacitance between the coil and the wiring inside the chip and between the coil and the signal line. Especially, since the length of the signal line is of the order of centimeters whereas that of the wire in the chip is of the order of microns so that the former occupies a larger area of the insulating substrate than the latter, the induction noise induced in the signal line is very large. In other words, the coils utilized to generate the rotating magnetic field constitute a source of a large external disturbance for the signal line when the currents flow through the coils. To decrease the induction noise in the signal line, it has been proposed to install a dummy or reference detector in the magnetic bubble chip and the dummy detector and the main detector were operated differentially. However, its noise decreasing effect was not sufficient.

SUMMARY OF THE INVENTION

Accordingly, it is an object of this invention to provide a novel magnetic bubble memory device in which the induction noise is decreased greatly.

According to this invention, there is provided a magnetic bubble memory device of the type comprising an insulating substrate, a magnetic bubble memory chip disposed at substantially the center of the insulating substrate, a plurality of lead pins secured to the insulating substrate at the end thereof, a plurality of signal lines formed on the insulating substrate between the magnetic bubble memory chip and the lead pins for passing small output signals, means for applying a perpendicular bias magnetic field to the magnetic bubble memory chip, and coils for producing a rotating magnetic field in a direction parallel with the memory chip, characterized by a plurality of grounded conductors disposed to surround positive signal lines of the signal lines for electrostatically shielding the same so as to decrease the noise induced in the positive signal lines by a voltage developing across the coils.

BRIEF DESCRIPITON OF THE DRAWINGS

Other objects and advantages of the invention can be more fully understood from the following detailed description taken in conjunction with the accompanying drawings in which.

DESCRIPTION OF THE PREFERRED EMBODIMENTS

Figure 1:
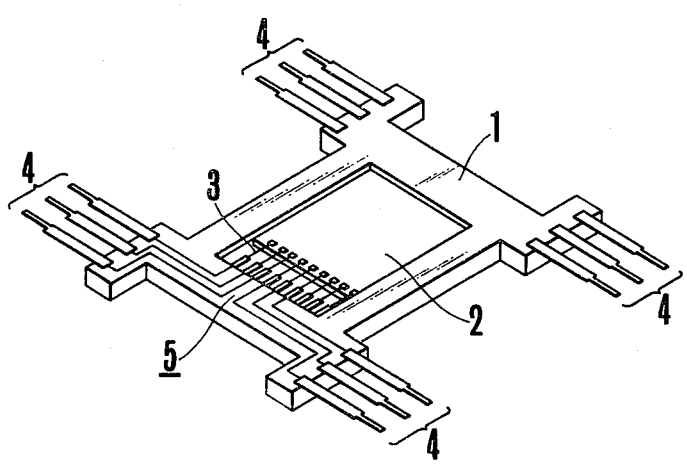
FIGS. 1 through 3 are perspective views of one example of a prior art magnetic bubble memory device, as illustrated with portions necessary for explaining the invention.
Figure 2:
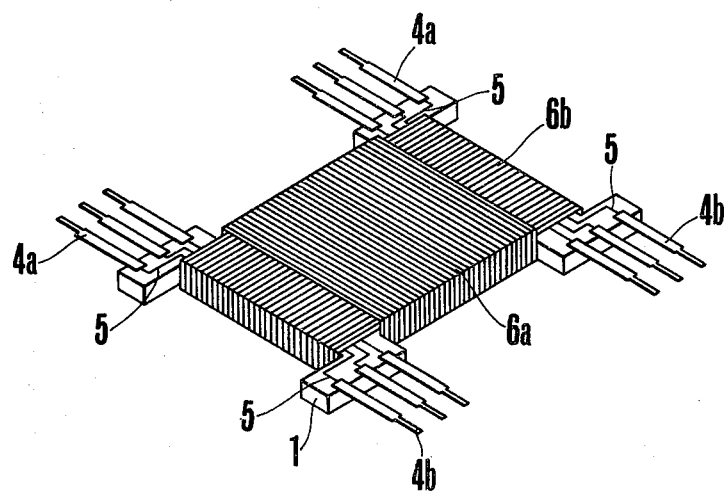
Figure 3:
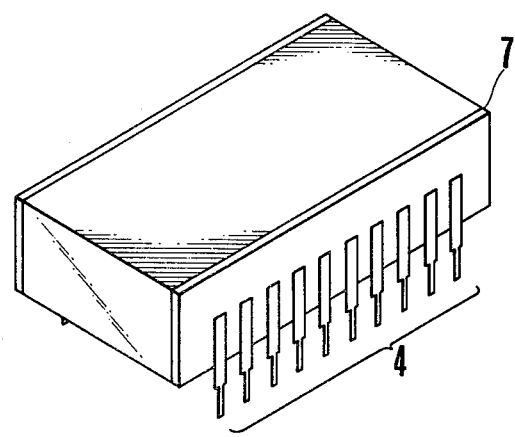

FIG. 1 shows a prior art magnetic bubble memory device, particularly one example of the inside of a ceramic package forming the magnetic bubble memory device. The ceramic package comprises a ceramic base 1 made of a ceramic insulating substrate and formed with a recess at its center for receiving a magnetic bubble memory chip 2 and bonding wires 3 thereon. The other ends of the bonding wires 3 are electrically connected to a plurality of lead pins 4 through signal lines 5 comprising a single layer of a conductor pattern formed by, for example, depositing gold or the like on the surface of the ceramic base 1. The lead pins are connected by through holes to external circuit formed on a printed board, particularly to a differential amplifier in a manner to be described later. As diagrammatically shown in FIG. 2, an X coil 6a and a Y coil 6b are wound respectively in the X axis and Y axis directions about the ceramic base 1, which contains the magnetic bubble memory chip 2 and the bonding wires 3 thereof, for providing a rotating magnetic field for the memory chip 2. These X coil 6a and Y coil 6b are sandwiched between a pair of plate shaped magnet blocks, not shown, which apply a bias magnetic field to the chip 2. The assembly is contained in a shield case 7 filled with resin to complete a magnetic bubble memory device as shown in FIG. 3.

Figure 4:
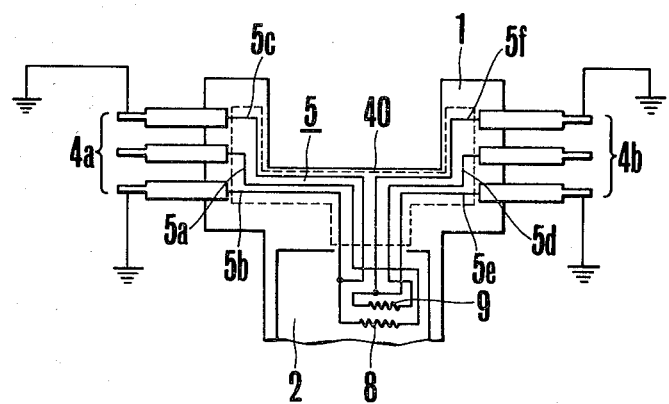
FIG. 4 is a plan view, partly broken, of the arrangement of signal lines of the magnetic bubble memory device embodying the invention.

While the output of a conventional core memory device is about 40 mV, the output of the magnetic bubble memory device described above is only 4 mV when measured by a main detector 8 shown in FIG. 4 with a detection current of 3 mA. For this reason, it is difficult to apply such a small output to an external amplifier via conductors 5 and lead pins 4a and 4b. More particularly, each of the X coil 6a and Y coil 6b is formed by winding a pair of conductors each having a diameter of 0.2 mm in the form of a quadruplicate layer, and sine wave currents having a phase difference of 90° from each other are passed respectively through coils 6a and 6b to generate a rotating magnetic field in the chip. To obtain a desired intensity of the rotating magnetic field, the peak value of a sine wave current I should be 400 mA. When each of the coils 6a and 6b has an inductance L of 40 μH and the rotating magnetic field has a frequency f of 200 KHz, a voltage of $V = 2\pi f \cdot L \cdot I \approx 20$ volts appears across each of coils 6a and 6b. These voltages induce induction noises on such conductors inside the chip as the main detector 8 and signal lines through capacitances between the coils 6a, 6b and these conductors and between the coils 6a, 6b and the signal lines on the substrate. Since the area of the insulating substrate 1 occupied by the lines 5 is much larger than that occupied by the internal conductors, the induction noise induced on the signal lines 5a and 5d is more important. Thus, since the magnitude of this induction noise amounts to 15 mV, this noise is cancelled by installing a dummy detector 9 in the memory chip 2. Even when such a differential amplifier is used, since the induction noise is large, noise of 3 mV still remains, thus degrading the magnetic bubble memory device.

As shown in FIG. 4, the positive terminal of the main detector 8 is connected to the central one of the lead pins 4a through a signal line 5a while the ground terminal is connected to outer ones of the lead pins 4a through ground lines 5b and 5c. In a similar manner, the positive terminal of the dummy detector 9 is connected to the central one of the lead pins 4b through signal line 5d whereas the negative terminal is connected to outer ones of the lead pins 4b through ground lines 5e and 5f. The central ones of the lead pins 4a and 4b are connected to the inputs of a differential amplifier, not shown, while the outer ones of the lead pins 4a and 4b are grounded.

According to this invention, the lines 5b, 5c or 5e, 5f are grounded along with bridging layers 10, 10a so as to surround the positive signal line 5a or 5d for shielding the induction noise for an area 40 as designated at dotted lines in FIG. 4.

Figure 5:
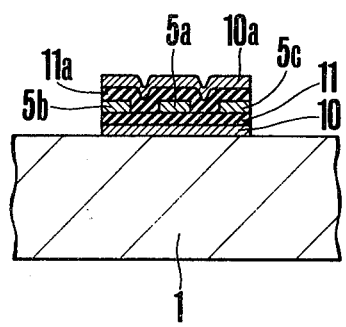
FIG. 5 is a sectional view showing one example of the arrangement of the signal line of the magnetic bubble memory device embodying the invention.

FIG. 5 is a sectional view of one example of a magnetic bubble memory device according to the invention, particularly the arrangement of a signal line and grounded conductors. More particularly, a lower grounded layer 10 made of tungsten having a predetermined width is deposited on the surface of an insulating substrate 1 made of ceramic, for example, and an alumina (Al₂O₃) insulating layer 11 is deposited on the entire surface of the grounded layer 10. Intermediate grounded layers comprised of the lines 5b, 5c or 5e, 5f, respectively also made of tungsten, are deposited on the opposite edges of the alumina insulating layer 11 and a signal line 5a (or 5d) made of tungsten or the like is formed between intermediate grounded lines 5b and 5c (or 5e and 5f). An alumina insulating layer 11a is applied to cover grounded lines 5b and 5c (or 5e and 5f) and the signal line 5a (or 5d,) and an upper grounded layer 10a which bridges the lines 5b and 5c is deposited on the alumina insulating layer 11a. Thus, a triple grounded layer structure surrounds the signal line 5a or 5d. In one example, grounded layers 10 and lines 5 have a thickness of 10 microns, while each of the alumina insulating layers 11 and 11a has a thickness of 50 microns and such layers can readily be formed by printing or coating.

With the construction described above in which the signal line 5a is surrounded or shielded by grounded layers 10, 5b, 5c and 10a which are electrically connected to the grounded one of the lead pins 4a and 4b, the electrostatic induction noise induced by the terminal voltages of the X and Y coils 6a and 6b utilized to generate the rotating magnetic field can be reduced to about 3 mV. After passing through a differential amplifier, the residual noise is decreased to less than 0.5 mV, which is only 1/6 of the conventional construction. With the signal line and ground layer both made of tungsten, it is possible to suppress decrease in quality factor of the X coil 6a and Y coil 6b.

Figure 6:
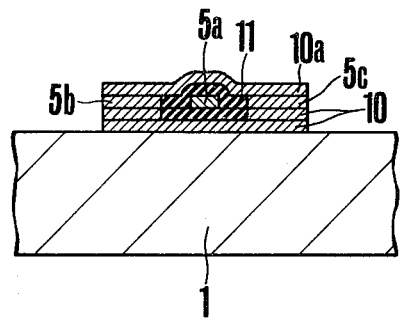
FIG. 6 is a view similar to FIG. 5 showing a modified arrangement of the signal line.

FIG. 6 is a sectional view showing a modified embodiment of this invention, elements corresponding to those shown in FIGS. 1 through 5 are designated by the same reference characters. This embodiment is different from that shown in FIG. 5 in that the four sides of the signal line 5a made of tungsten are completely surrounded or shielded by grounded layers 10, 5b, 5c and 10a made of tungsten through the alumina insulating layer 11.

Again the induction noise was reduced to 3 mV and the residual noise after differential amplification was reduced to less than 0.3 mV, which is only 1/10 of the conventional construction.

While in the above-described embodiments, lines 5 and grounded layers 10, 10a were made of tungsten, it is clear that tungsten alloys or any other metal can be used. Furthermore, instead of arranging the grounded conductor about the signal line in the form of a triple layer, the shielding conductors may be arranged in the form of a multiple, more than triple, layer.

As described above, according to the magnetic bubble memory device of this invention, it is possible to greatly decrease the electrostatically induced noise caused by the X and Y coils adapted to generate the rotating magnetic field, thus improving the quality and characteristics of the magnetic bubble memory device.

What is claimed is:

1. In a magnetic bubble memory device of the type comprising an insulating substrate, a magnetic bubble memory chip disposed at substantially the center of said insulating substrate, a plurality of lead pins secured to said insulating substrate at the end thereof, a plurality of planar electrically conducting lines comprising signal lines and ground lines formed on said insulating substrate between said magnetic bubble memory chip and said lead pins for passing small output signals, means for applying a perpendicular bias magnetic field to said magnetic bubble memory chip, and coils for producing a rotating magnetic field in a direction parallel with said memory chip, the improvement which comprises a plurality of grounded conductors including said ground lines disposed to surround signal lines of said plurality of lines for electrostatically shielding the same from said coils so as to decrease noise induced in said signal lines by a voltage developing across said coils.

2. THe magnetic bubble memory device according to claim 1 wherein said grounded conductors are disposed above, below, and at the sides of said signal lines to form a triple layer of grounded conductors.

3. The magnetic bubble memory device according to claim 1 wherein the signal lines and grounded conductors are made of tungsten.

4. The magnetic bubble memory device according to claim 1 wherein an insulator layer is interposed between said grounded conductors.

* * * * *